(12) United States Patent
Kim

(10) Patent No.: US 10,396,132 B2
(45) Date of Patent: Aug. 27, 2019

(54) DISPLAY DEVICE

(71) Applicant: Samsung Display Co. Ltd., Yongin-si, Gyeonggi-do (KR)

(72) Inventor: Joo Suc Kim, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/973,834

(22) Filed: May 8, 2018

(65) Prior Publication Data

US 2019/0148458 A1    May 16, 2019

(30) Foreign Application Priority Data

Nov. 15, 2017    (KR) .................. 10-2017-0152058

(51) Int. Cl.
*H01L 27/32* (2006.01)
*H01L 51/50* (2006.01)

(52) U.S. Cl.
CPC .......... *H01L 27/322* (2013.01); *H01L 51/502* (2013.01)

(58) Field of Classification Search
CPC ................................ H01L 33/24; H01L 51/52
See application file for complete search history.

(56) References Cited

U.S. PATENT DOCUMENTS

| | | | | |
|---|---|---|---|---|
| 2003/0127968 A1* | 7/2003 | Kuma | .................. | H01L 27/3211 313/503 |
| 2013/0016296 A1* | 1/2013 | Fujita | .................... | H01L 27/322 349/42 |
| 2013/0334547 A1* | 12/2013 | Yoneda | .................... | H01L 33/24 257/89 |
| 2015/0362165 A1* | 12/2015 | Chu | .................... | H01L 25/0753 362/235 |
| 2016/0091757 A1* | 3/2016 | Miki | .................. | G02F 1/133617 349/42 |
| 2017/0205666 A1 | 7/2017 | Suh | | |
| 2018/0122836 A1* | 5/2018 | Kang | .................... | H01L 27/124 |

FOREIGN PATENT DOCUMENTS

| | | |
|---|---|---|
| KR | 10-1329493 B1 | 11/2013 |
| KR | 10-2016-0000569 A | 1/2016 |
| KR | 10-2017-0078553 A | 7/2017 |

* cited by examiner

*Primary Examiner* — Caridad Everhart
*Assistant Examiner* — Ankush K Singal
(74) *Attorney, Agent, or Firm* — Innovation Counsel LLP

(57) ABSTRACT

A display device includes: a display element; a wavelength conversion element disposed on the display element and comprising a plurality of first wavelength conversion layers and a plurality of second wavelength conversion layers arranged in a first predetermined pattern; a transparent frame disposed on the wavelength conversion element and having a plurality of air gaps defined on a surface facing the wavelength conversion element, wherein the air gaps are recessed in a thickness direction; and a color filter element disposed on the transparent frame and comprising a plurality of first wavelength filter layers, a plurality of second wavelength filter layers and a plurality of third wavelength filter layers arranged in a second predetermined pattern, wherein the first and second wavelength filter layers are arranged to overlap the first and second wavelength conversion layers, respectively, and wherein the air gaps are arranged to overlap the first and second wavelength conversion layers.

20 Claims, 7 Drawing Sheets

DISPLAY DEVICE

This application claims priority from Korean Patent Application No. 10-2017-0152058, filed on Nov. 15, 2017, in the Korean Intellectual Property Office, and all the benefits accruing therefrom under 35 U.S.C. 119, the disclosure of which is herein incorporated by reference in its entirety.

BACKGROUND

1. Field of the Disclosure

The present disclosure relates to a display device, and more particularly to a display device including color conversion elements such as a wavelength conversion element and a color filter element.

2. Description of the Related Art

A display device may include color conversion elements that receive light from a light source, for example, a display element such as an organic light-emitting element and convert the received light to represent colors. The color conversion elements may be disposed in a display device as a separate substrate or may be integrated with other elements in the display device.

As an example, the color conversion elements may receive white light from the display element and may emit red, green, and blue colors, respectively, so that an image having various colors can be displayed. In doing so, wavelength-converting particles included in the color conversion elements can increase the color purity and the luminous efficiency by converting the received white light into red and green.

While the light provided from the display element transmits through a layer containing the wavelength-converting particles, some of the light may not be converted into red or green but may be absorbed or scattered by a filter layer and leak back to the display element and so on, resulting in optical loss. As a result, the luminous efficiency, the luminance, and the like may be deteriorated.

SUMMARY

Aspects of the present disclosure provide a display device capable of improving the luminous efficiency and luminance by reusing light that is lost in the course of transmitting through a layer containing wavelength-converting particles.

These and other aspects, embodiments and advantages of the present disclosure will become immediately apparent to those of ordinary skill in the art upon review of the Detailed Description and Claims to follow.

According to an exemplary embodiment of the present disclosure, a display device includes: a display element; a wavelength conversion element disposed on the display element and comprising a plurality of first wavelength conversion layers and a plurality of second wavelength conversion layers arranged in a first predetermined pattern; a transparent frame disposed on the wavelength conversion element and having a plurality of air gaps defined on a surface facing the wavelength conversion element, wherein the air gaps are recessed in a thickness direction; and a color filter element disposed on the transparent frame and comprising a plurality of first wavelength filter layers, a plurality of second wavelength filter layers and a plurality of third wavelength filter layers arranged in a second predetermined pattern, wherein the first and second wavelength filter layers are arranged to overlap the first and second wavelength conversion layers, respectively, and wherein the air gaps are arranged to overlap the first and second wavelength conversion layers.

In an exemplary embodiment, the first and second wavelength conversion layers may convert light provided from the display element into lights of first and second wavelength bands, respectively, wherein the first, second, and third wavelength filter layers may transmit lights of first, second, and third wavelength bands, respectively, and wherein the first, second, and third wavelength bands may be different from one another.

In an exemplary embodiment, the display element may emit lights including the first, second, and third wavelength bands.

In an exemplary embodiment, the first, second, and third wavelength bands may be red, green, and blue wavelength bands, respectively.

In an exemplary embodiment, the display element may emit white light.

In an exemplary embodiment, a refractive index of the air gaps may be lower than refractive indices of the first and second wavelength conversion layers.

In an exemplary embodiment, the transparent frame may include a polymer.

In an exemplary embodiment, the wavelength conversion element may include: a base substrate, wherein the plurality of first and second wavelength conversion layers are arranged in the base substrate in the first predetermined pattern.

In an exemplary embodiment, a thickness of the wavelength conversion element may be equal to or less than 2 μm.

In an exemplary embodiment, none of the first and second wavelength conversion layers may be disposed at regions in the base substrate that correspond to the third wavelength filter layers.

In an exemplary embodiment, the wavelength conversion element and the transparent frame may be in contact with each other at least partially.

In an exemplary embodiment, the transparent frame and the color filter element may be in contact with each other at least partially.

In an exemplary embodiment, the first and second wavelength conversion layers may include quantum dots.

According to another exemplary embodiment of the present disclosure, a display device includes: a display element having a plurality of pixels defined thereon; a color filter element disposed on the display element and comprising a plurality of first wavelength filter layers, a plurality of second wavelength filter layers and a plurality of third wavelength filter layers, each of the first, second, and third wavelength filter layers being arranged with the respective pixels; a wavelength conversion element disposed between the display element and the color filter element and comprising a plurality of first wavelength conversion layers and a plurality of second wavelength conversion layers arranged to overlap the first and second wavelength filter layers, respectively; and a transparent frame disposed between the color filter element and the wavelength conversion element and having a plurality of air holes formed through the transparent frame, wherein the air holes are arranged at locations corresponding to the first and second wavelength conversion layers, respectively.

In an exemplary embodiment, the plurality of air holes may be formed through the transparent frame at regions corresponding to the third wavelength filter layers.

In an exemplary embodiment, the first and second wavelength conversion layers may convert white light provided from the display element into red and green light, respectively, and wherein the first, second, and third wavelength filter layers may transmit red, green, and blue lights, respectively.

In an exemplary embodiment, a thickness of each of the first and second wavelength conversion layers may be equal to or less than 2 μm.

In an exemplary embodiment, the wavelength conversion element and the transparent frame may be in contact with each other at least partially.

In an exemplary embodiment, the transparent frame and the color filter element may be in contact with each other at least partially.

In an exemplary embodiment, the first and second wavelength conversion layers may include quantum dots.

According to exemplary embodiments of the present disclosure, at least following effects can be achieved:

The air gaps interposed between the wavelength conversion element and the color filter element may induce total reflection of light to reuse the light, thereby improving the luminous efficiency, luminance, and the like of the display device.

It should be noted that effects of the present disclosure are not limited to those described above, and other effects of the present disclosure will be apparent to those skilled in the art from the following descriptions.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
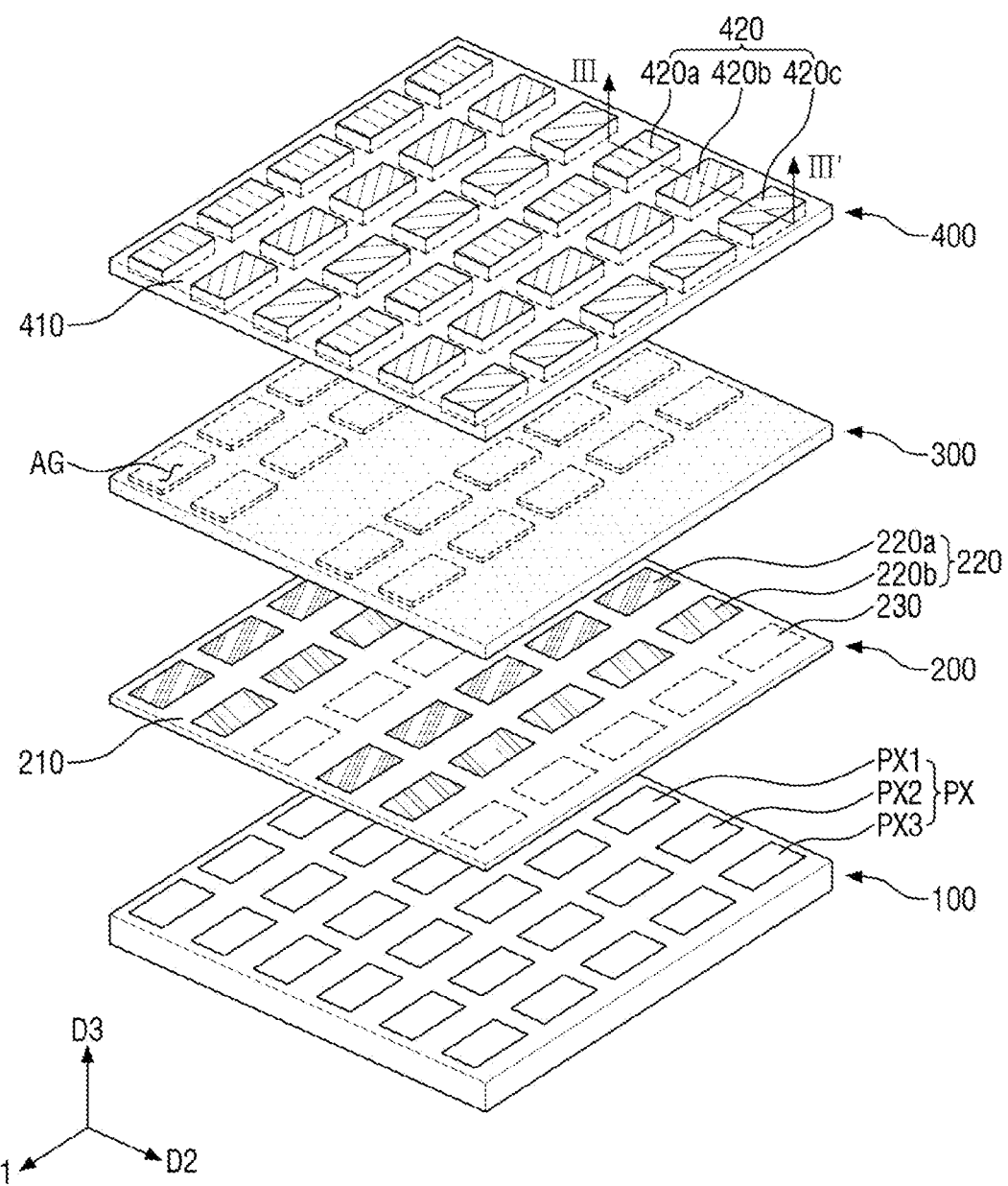
FIG. 1 is an exploded, perspective view of a display device according to an exemplary embodiment of the present disclosure.

Features of the present disclosure and methods of accomplishing the same may be understood more readily by reference to the following detailed description of example embodiments and the accompanying drawings. The present disclosure may, however, be embodied in many different forms and should not be construed as being limited to the example embodiments set forth herein. Rather, these example embodiments are provided so that the present disclosure will be thorough and complete and will fully convey the concept of the present disclosure to those skilled in the art.

It will be understood that when an element or layer is referred to as being "on," "connected to" or "coupled to" another element or layer, the element or layer can be directly on, connected or coupled to another element or layer or one or more intervening elements or layers. In contrast, when an element is referred to as being "directly on," "directly connected to" or "directly coupled to" another element or layer, there are no intervening elements or layers present. As used herein, "connected" may refer to an element being physically, electrically, and/or fluidly connected to another element.

Like numbers refer to like elements throughout the present disclosure. As used herein, the term "and/or" includes any and all combinations of one or more of the associated listed items.

It will be understood that, although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present disclosure.

Spatially relative terms, such as "below," "lower," "under," "above," "upper," and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" relative to other elements or features would then be oriented "above" relative to the other elements or features. Thus, the exemplary term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments only and is not intended to be limiting. As used herein, the singular forms "a," "an," and "the" are intended to include the plural forms as well, including "at least one," unless the context clearly indicates otherwise. It will be further understood that the terms "comprises," "comprising," "includes," and/or "including," when used in the present disclosure, specify the presence of stated features, integers, operations, elements, and/or components, but do not preclude the presence or addition of one or more other features, integers, steps, operations, elements, components, and/or groups thereof. "At least one" is not to be construed as limiting "a" or "an." "Or" means "and/or." As used herein, the term "and/or" includes any and all combinations of one or more of the associated listed items.

Hereinafter, exemplary embodiments of the present disclosure will be described with reference to the accompanying drawings.

Figure 2:
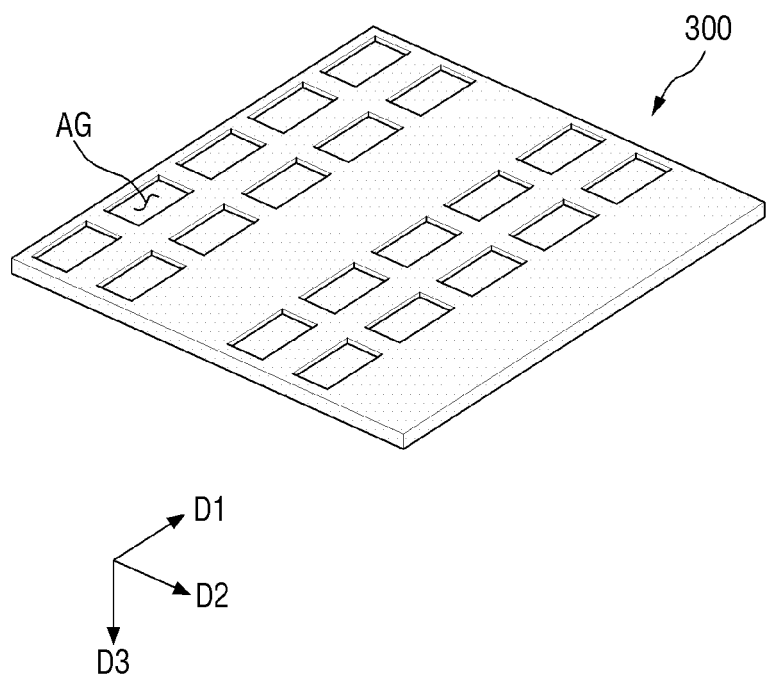
FIG. 2 is a perspective view showing a rear surface of a transmissive frame shown in FIG. 1.
Figure 3:
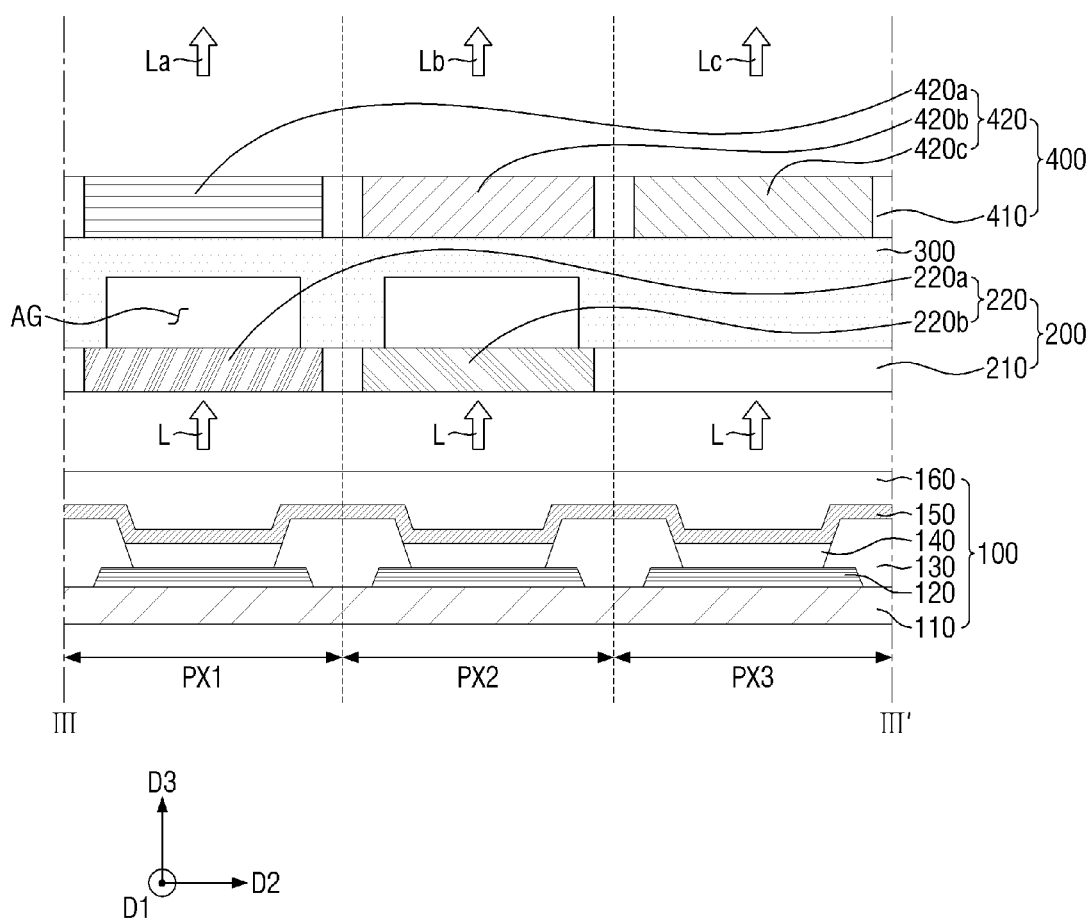
FIG. 3 is a cross-sectional view taken along line III-III' of the display device shown in FIG. 1.

FIG. 1 is an exploded, perspective view of a display device 10 according to an exemplary embodiment of the present disclosure. FIG. 2 is a perspective view showing a rear surface of a transparent frame 300 shown in FIG. 1. FIG. 3 is a cross-sectional view taken along line III-III' of the display device 10 shown in FIG. 1.

Referring to FIGS. 1 and 3, the display device 10 includes a display element 100, a wavelength conversion element 200, a transparent frame 300, and a color filter element 400 stacked on one another in the vertical direction D3.

The display element 100 may be an organic light-emitting display (OLED) capable of emitting light on its own by formation of excitons in an organic material. The display element 100 may emit light through the plurality of pixels PX. The plurality of pixels PX may be arranged in a matrix of rows in the first direction D1 and columns in the second direction D2 perpendicular to the first direction D1 on the display element 100 when viewed from the top.

The display element 100 may include a supporting substrate 110, a first electrode 120, a pixel-defining layer 130, an organic layer 140, a second electrode 150, and a capping layer 160.

Elements such as the organic layer 140 are disposed on the supporting substrate 110. The supporting substrate 110 may include wiring, electrodes, semiconductors, insulating layers and the like for driving the display element 100.

The first electrode 120 may be disposed on the supporting substrate 110. The first electrode 120 may be disposed within an area of each of the pixels PX1, PX2, and PX3 of the display element 100. The first electrode 120 may be a pixel electrode or an anode electrode of the display element 100.

The pixel-defining layer 130 may be disposed on the supporting substrate 110. The pixel-defining layer 130 may have openings to define the plurality of pixels PX on the display element 100 when viewed from the top. The opening may expose at least a portion of the first electrode 120 in each of the pixels PX1, PX2, and PX3.

The organic layer 140 may be disposed on the exposed portion of the first electrode 120 via the opening. The organic layer 140 may include an organic material that emits light as holes and electrons form excitons. The organic layer 140 may further include at least one of a hole injection layer, a hole transport layer, an electron transport layer, and an electron injection layer together with an emission layer containing the organic material.

The second electrode 150 may be disposed on the organic layer 140. The second electrode 150 may be disposed to cover both the organic layer 140 and the pixel-defining layer 130. The second electrode 150 may be a common electrode or a cathode electrode of the display element 100.

The capping layer 160 may be disposed to seal the display element 100 so that foreign matter or moisture are prevented from permeating into the organic layer 140.

A planarization layer (not shown) for providing a flat surface over the display element 100 may be further disposed on the capping layer 160.

The display element 100 may emit light L of substantially the same wavelength band in all of the pixels PX. Specifically, the plurality of pixels PX of the display element 100 may emit light L including all of the first wavelength band, the second wavelength band, and the third wavelength band. The first, second, and third wavelength bands may correspond to the wavelength bands of the light that is converted or filtered by the wavelength conversion element 200 and the color filter element 400, which will be described later.

In an exemplary embodiment, the first wavelength band may be the wavelength band of red ranging from approximately 622 nm to 780 nm, the second wavelength band may be the wavelength band of green ranging from approximately 492 nm to 577 nm, and the third wavelength band may be the wavelength band of blue ranging from approximately 390 nm to 492 nm. It is, however, to be understood that the wavelength bands of red, green, and blue are not limited to the above ranges and may cover other wavelength ranges that can be recognized as red, green, and blue in the art.

According to one embodiment, the display element 100 may emit white light including all of the wavelength bands of red, green, and blue. Further, the white light of the display element 100 may include the wavelength band of approximately 597 nm to 622 nm (orange) and the wavelength band of approximately 577 nm to 597 nm (yellow).

The organic layer 140 of the display element 100 may have a structure in which a plurality of emission layers is stacked on one another (tandem structure) to emit light L including all of the first, second, and third wavelength bands, i.e., white light. It is, however, to be understood that this is merely an example.

The wavelength conversion element 200, the transparent frame 300, and the color filter element 400 may be disposed on the display element 100. The wavelength conversion element 200, the transparent frame 300, and the color filter element 400 may work as a signal color conversion module representing a particular wavelength band, i.e., a color, using the light L provided from the display element 100. The wavelength conversion element 200, the transparent frame 300, and the color filter element 400 may represent a color by converting the wavelength of light L provided from the display element 100 or filtering light of a particular wavelength. Further, the wavelength conversion element 200, the transparent frame 300, and the color filter element 400 may determine the purity of the light and the viewing angle.

The wavelength conversion element 200 is disposed between the display element 100 and the transparent frame 300. The wavelength conversion element 200 may include a base substrate 210 and a plurality of wavelength conversion layers 220.

The base substrate 210 provides a support for disposing the plurality of wavelength conversion layers 220 and may be made of a light-transmitting or light-blocking polymer material. The base substrate 210 may have a thin panel shape having the same size as and conforming to the planar shape of the display element 100.

The plurality of wavelength conversion layers 220 may be disposed on the base substrate 210 in a predetermined pattern. It is, however, to be understood that this is merely an example. The plurality of wavelength conversion layers 220 may be disposed on the base substrate 210 as separate elements.

The plurality of wavelength conversion layers 220 may be divided into a first wavelength conversion layer 220a and a second wavelength conversion layer 220b. The first wavelength conversion layer 220a and the second wavelength conversion layer 220b may be arranged in the first direction D1 and the second direction D2 to form a matrix, like the pixels PX of the display element 100.

The first wavelength conversion layer 220a may receive light to emit light of the first wavelength band. Specifically, the first wavelength conversion layer 220a may convert light L received from the display element 100 into light of the first wavelength band.

In an exemplary embodiment, as described above, the first wavelength band may be the red wavelength band ranging from approximately 622 to 780 nm, and the display element 100 may provide white light including the red wavelength band. That is, the first wavelength conversion layer 220a may convert some of the white light of wavelength band out of the red wavelength band into red.

The second wavelength conversion layer 220b may receive light to emit light of the second wavelength band. Specifically, the second wavelength conversion layer 220b may convert light L received from the display element 100 into light of the second wavelength band.

In an exemplary embodiment, as described above, the second wavelength band may be the green wavelength band ranging from approximately 492 to 577 nm, and the display element 100 may provide white light including the green wavelength band. That is, the second wavelength conversion layer 220b may convert some of the white light of wavelength band out of the green wavelength band into green.

Each of the first wavelength conversion layer 220a and the second wavelength conversion layer 220b may include wavelength-converting particles to convert the wavelength of the received light. The wavelength-converting particles may include, for example, quantum dots (QD), fluorescent particles, or phosphorescent particles.

Quantum dots will be further described as an example of wavelength-covering particles. A quantum dot is a material with a crystal structure of several nanometers in size and consists of hundreds to thousands of atoms. It exhibits the quantum confinement effect that leads to an increase in the energy band gap due to its small size. When a light of a wavelength having an energy level higher than the bandgap is incident on a quantum dot, the quantum dot is excited by absorbing the light and relaxed to a ground state while emitting light of a particular wavelength. The emitted light of the wavelength has a value corresponding to the band gap. By controlling the size and composition of the quantum dots, the luminescence characteristics due to the quantum confinement effect can be controlled.

A quantum dot may include, for example, at least one of a group II-VI compound, a group II-V compound, a group III-VI compound, a group III-V compound, a group IV-VI compound, a group compound, a group II-IV-VI compound, and a group II-IV-V compound.

A quantum dot may include a core and a shell overcoating the core. The core may be, but not limited to, at least one of CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, Fe2O3, Fe3O4, Si and Ge. The shell may include, but not limited to, at least one of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe and PbTe.

When light is incident on the wavelength-converting particles and then is emitted after its wavelength has been converted, it has scattering characteristic, i.e., the light is emitted in random directions (Lambertian emission). Accordingly, the wavelength conversion layers 220 including such wavelength-converting particles can have uniform luminance of the light emitted from the wavelength conversion layers 220 on the front and side surfaces, even without additional scatterers. It is to be understood that the wavelength conversion layers 220 may include additional scatterers to further increase the light conversion efficiency.

The first wavelength conversion layer 220a and the second wavelength conversion layer 220b may be formed by inserting the above-described wavelength-converting particles into the base substrate 210. The wavelength conversion element 200 may be a thin layer having a thickness of 2 μm or less.

Although the plurality of wavelength conversion layers 220 is formed in the base substrate 210 in the foregoing description, this is merely an example. The plurality of wavelength conversion layers 220 may be formed by applying the above-described wavelength-converting particles onto a surface of the base substrate 210. In this case, each of the plurality of wavelength conversion layers 220 may be formed as a thin layer having a thickness of 2 μm or less.

The plurality of wavelength conversion layers 220 may be disposed to overlap only some pixels PX1 and PX2 among the plurality of pixels PX of the display element 100 and may not be disposed at locations of the wavelength conversion element 200 corresponding to the remaining pixels PX3. The locations of the wavelength conversion element 200 in line with pixels PX3 where the wavelength conversion layers 220 are not disposed may be defined as a light-transmitting portion 230.

If the base substrate 210 is made of a transparent material, the light-transmitting portion 230 may not need to be explicitly defined. If the base substrate 210 is made of a non-transparent material, on the other hand, the light-transmitting portion 230 may be defined, e.g., by forming an opening in the base substrate 210 or by disposing a transparent material on the base substrate 210 in the regions corresponding to the pixels PX3.

As shown in the drawings, in the first direction D1, the same layers, i.e., the first wavelength conversion layer 220a, the second wavelength conversion layer 220b, or the light-transmitting portion 230 may be arranged repeatedly. In the second direction D2, different layers may be arranged one after another. The pixel PX corresponding to the first wavelength conversion layer 220a may be defined as a first pixel PX1, the pixel PX corresponding to the second wavelength conversion layer 220b may be defined as a second pixel PX2, and the pixel PX corresponding to the light-transmitting portion 230 may be defined as a third pixel PX3.

The transparent frame 300 is disposed on the wavelength conversion element 200. The transparent frame 300 may be a panel-shaped frame containing a polymer.

As shown in FIG. 2, a plurality of air gaps AG may be defined in the rear surface (or lower surface) of the transparent frame 300, i.e., the surface facing the wavelength conversion element 200 that is recessed in the thickness direction D3. In other words, the plurality of air gaps AG may be a pattern of recesses that are recessed in the rear surface (or lower surface) of the transparent frame 300 toward the front surface (or upper surface).

The plurality of air gaps AG may be formed only at locations corresponding to the plurality of wavelength conversion layers 220 of the wavelength conversion element 200. For example, the plurality of air gaps AG may be formed only at locations corresponding to the first and second pixels PX1 and PX2. Since the air gaps AG are empty spaces filled with air or in vacuum, the refractive index inside the air gaps AG may be lower than refractive indices of the first and second wavelength conversion layers 220a and 220b. Accordingly, the plurality of air gaps AG can induce total reflection of light to be incident on the air gaps AG at an angle of approximately 37 degrees or more from the wavelength conversion layers 220, thereby reusing the light.

Specifically, the wavelength-converting particles contained in the first wavelength conversion layer 220a receive the light L provided from the display element 100 and convert the light out of the first wavelength band into the light of the first wavelength band. Some of the light, however, may not pass through the first wavelength conversion layer 220a without hitting the wavelength-converting particles, such that the luminous efficiency may be deteriorated. Accordingly, the air gaps AG disposed above the first wavelength conversion layer 220a may induce total reflection such directly transmitted light (i.e., light that did not hit the wavelength-conversion particles) toward the wavelength-converting particles, thereby improving the luminous efficiency. The second wavelength conversion layer 220b can also improve the luminous efficiency in the same manner The transparent frame 300 made of a transparent material may transmit upwardly the light that has passed through the plurality of air gaps AG or the light that is incident on the portion where no air gap AG is formed (i.e., the portion corresponding to the third pixel PX3 and the light-transmitting portion 230), with substantially no optical loss.

The transparent frame 300 may be disposed directly on the wavelength conversion element 200. The wavelength conversion element 200 and the transparent frame 300 may be in contact with each other at least partially. Specifically, the upper surface of the wavelength conversion element 200 may come in contact with the portion of the lower surface of the transparent frame 300 where no air gap AG is defined.

The color filter element 400 is disposed on the transparent frame 300. The color filter element 400 may include a base panel 410 and a plurality of wavelength filter layers 420. The base panel 410 may be a light-blocking structure for supporting the plurality of wavelength filter layers 420. The base panel 410 may have the same shape and size as those of the display element 100. The plurality of wavelength filter layers 420 may be disposed in the base panel 410 in a predetermined pattern.

The plurality of wavelength filter layers 420 may include a first wavelength filter layer 420a, a second wavelength filter layer 420b, and a third wavelength filter layer 420c. The first wavelength filter layer 420a may be disposed to overlap the first pixel PX1 and the first wavelength conversion layer 220a, the second wavelength filter layer 420b may be disposed to overlap the second pixel PX2 and the second wavelength conversion layer 220b, and the third wavelength filter layer 420c may be disposed to overlap the third pixel PX3 and the light-transmitting portion 230. The first and second wavelength filter layers 420a and 420b may correspond to the regions having an air gap AG, while there may be no air gap AG at the regions corresponding to the third wavelength filter layer 420c.

The first wavelength filter layer 420a may transmit the light La of the first wavelength band only. Specifically, the first wavelength filter layer 420a that receives the light L that is provided from the display element 100 and has passed through the wavelength conversion element 200 and the transparent frame 300 may be a color filter or a wavelength-selective optical filter that transmits the light La of the first wavelength band only while absorbing or reflecting the light of other wavelength bands.

In an exemplary embodiment, as described above, the first wavelength band may be the red wavelength band ranging from approximately 622 nm to 780 nm. That is, the first wavelength filter layer 420a receives the light provided from the first wavelength conversion layer 220a and may transmit the red light only while blocking some of the light that is not converted into red, thereby representing a high-purity red color.

The second wavelength filter layer 420b may transmit the light Lb of the second wavelength band only. Specifically, the second wavelength filter layer 420b that receives the light L that is provided from the display element 100 and has passed through the wavelength conversion element 200 and the transparent frame 300 may be a color filter or a wavelength-selective optical filter that transmits the light Lb of the second wavelength band only while absorbing or reflecting the light of other wavelength bands.

In an exemplary embodiment, as described above, the second wavelength band may be the green wavelength band ranging from approximately 492 nm to 577 nm. That is, the second wavelength filter layer 420b receives the light provided from the second wavelength conversion layer 220b and may transmit the green light only while blocking some of the light that is not converted into green, thereby representing a high-purity green color.

The third wavelength filter layer 420c may transmit the light Lc of the third wavelength band only. Specifically, the third wavelength filter layer 420c that receives the light L that is provided from the display element 100 may be a color filter or a wavelength-selective optical filter that transmits the light Lc of the third wavelength band only while absorbing or reflecting the light of other wavelength bands.

In an exemplary embodiment, as described above, the third wavelength band may be the blue wavelength band ranging from approximately 390 nm to 492 nm. That is, the third wavelength filter layer 420c may receive the white light provided from the display element 100 having passed through the light-transmitting portion 230 of the wavelength conversion element 200 and the transparent frame 300 and may transmit blue light only, thereby representing a blue color.

The color filter element 400 may be disposed directly on the transparent frame 300. The transparent frame 300 and the color filter element 400 may be disposed to be in contact with each other at least partially. Specifically, the upper surface of the transparent frame 300 may be in contact with the lower surface of the color filter element 400.

The principle of the display device 10 having the above-described configuration to represent a particular color may be summarized as follows: The light L of the same wavelength band provided from each of the pixels PX1, PX2 and PX3 of the display element 100 passes through the wavelength conversion element 200, the transparent frame 300, and the color filter element 400 to emit lights of the first, second, and third wavelength bands La, Lb and Lc. The wavelength conversion element 200 and the transparent frame 300 that is disposed between the display element 100 and the color filter element 400 improve the color purity and luminous efficiency of the light of each of the wavelength bands emitted from the color filter element 400.

Figure 4:
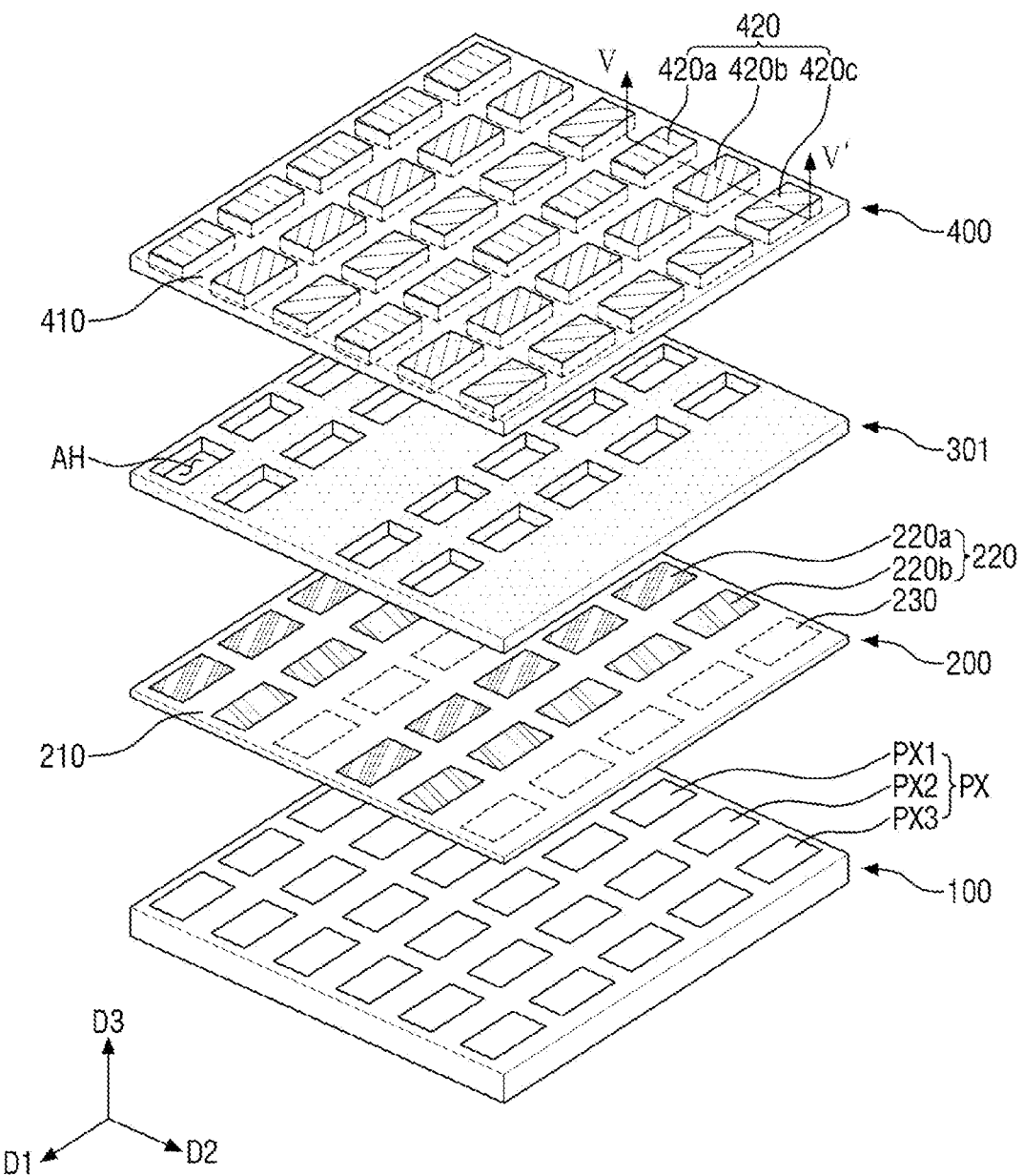
FIG. 4 is an exploded, perspective view of a display device according to another exemplary embodiment of the present disclosure.
Figure 5:
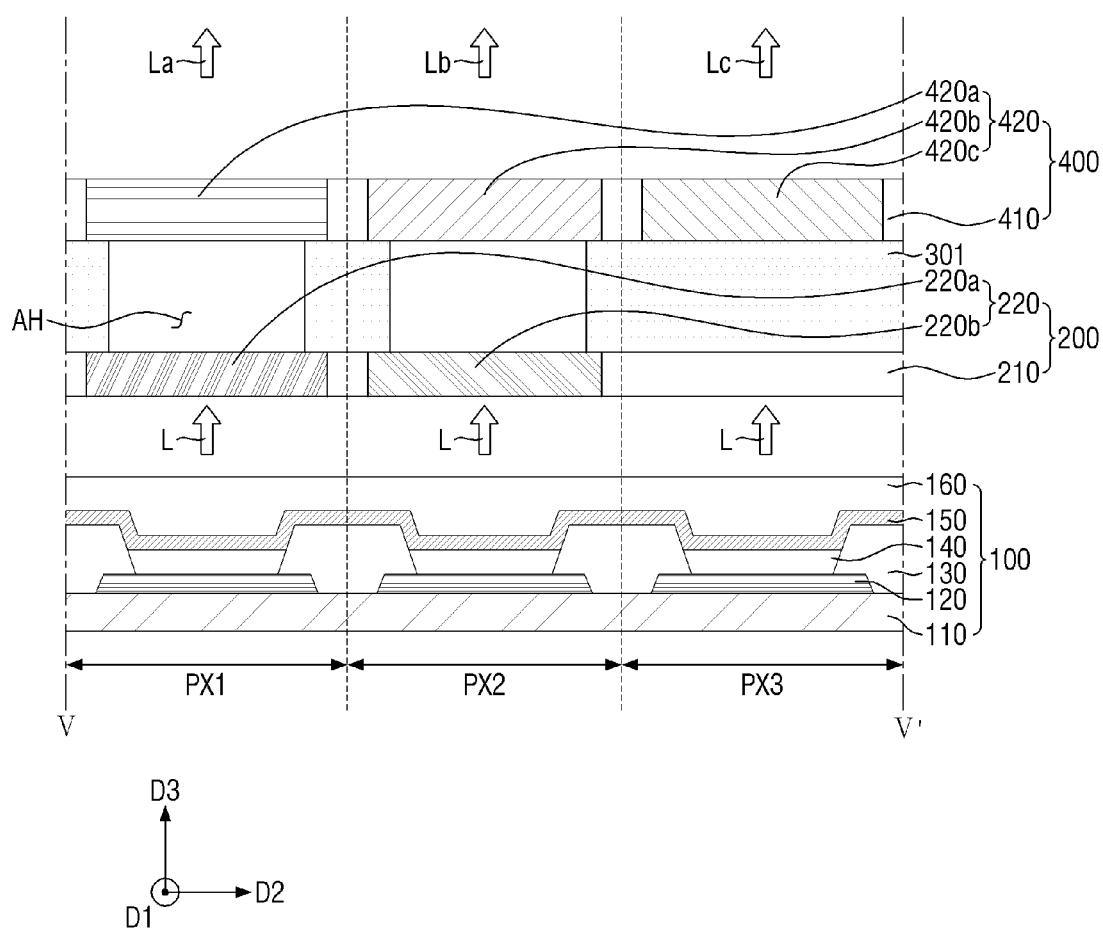
FIG. 5 is a cross-sectional view taken along line V-V' of the display device shown in FIG. 4.

FIG. 4 is an exploded, perspective view of a display device 20 according to another exemplary embodiment of the present disclosure. FIG. 5 is a cross-sectional view taken along line V-V' of the display device 20 of FIG. 4.

The display device 20 of FIGS. 4 and 5 is identical to the display device 10 described above with reference to FIGS. 1 to 3 except that a plurality of air holes AH is defined in a transparent frame 301 in place of the plurality of air gaps AG. Hereinafter, the redundant description will be omitted, and description will be made focusing on the differences.

Referring to FIGS. 4 and 5, a plurality of air holes AH may be defined in the transparent frame 301 that is formed through some portions of the transparent frame 301, in place of the plurality of air gaps AG.

Like the plurality of air gaps AG, the plurality of air holes AH may be formed to overlap only the first wavelength conversion layer 220a and the second wavelength conversion layer 220b of the wavelength conversion element 200 and the first pixel PX1 and the second pixel PX2.

Referring to FIG. 3, the air gaps AG are partially recessed portions of the transparent frame 301 in the thickness direction D3, therefore light passes through the air gaps AG and then passes through the remaining parts of the transparent frame 300. Meanwhile, there may be minute optical loss. In contrast, the air holes AH are formed through the transparent frame 301 completely, and thus the display device 20 may further reduce the optical loss.

Figure 6:
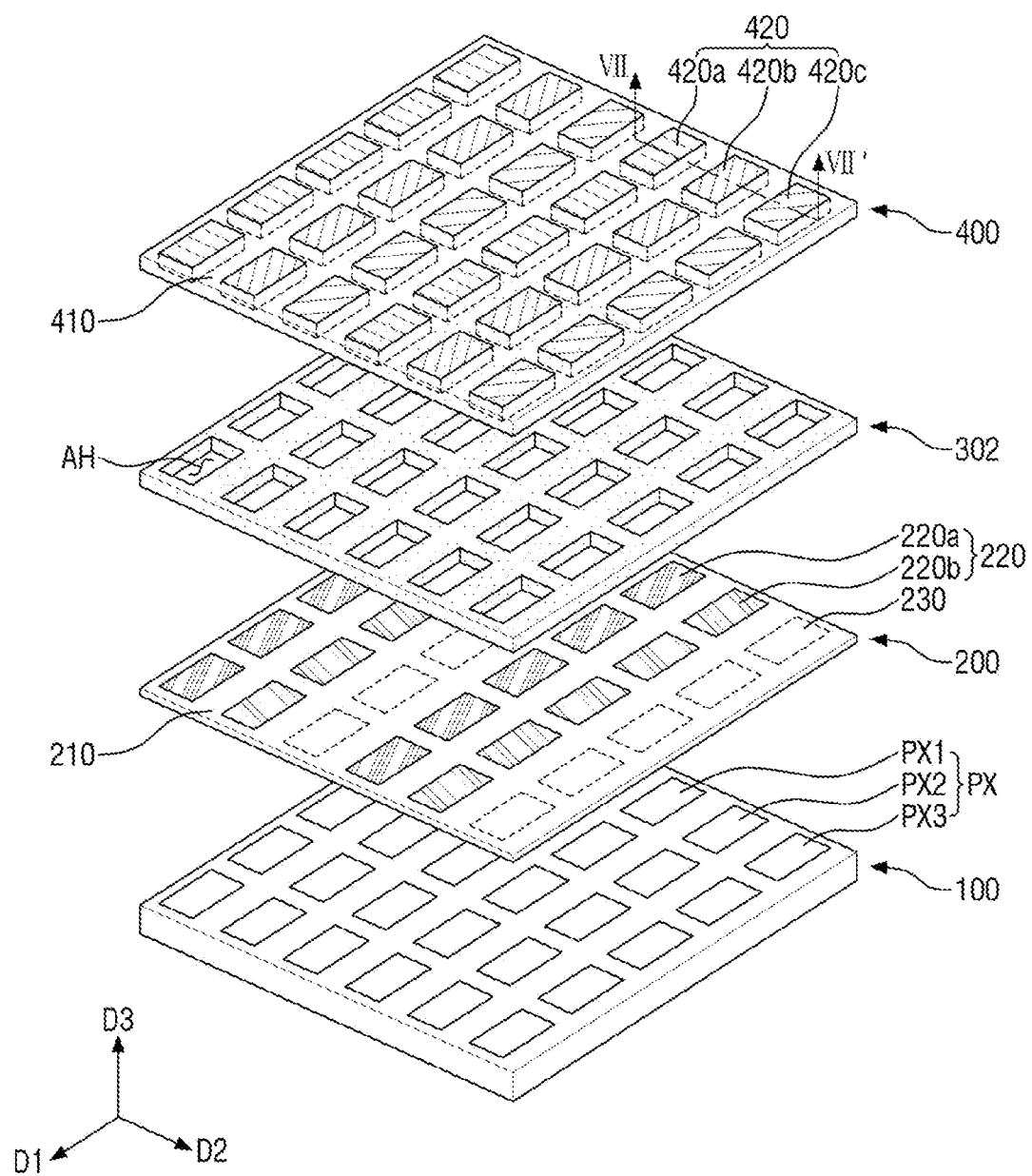
FIG. 6 is an exploded, perspective view of a display device according to another exemplary embodiment of the present disclosure.
Figure 7:
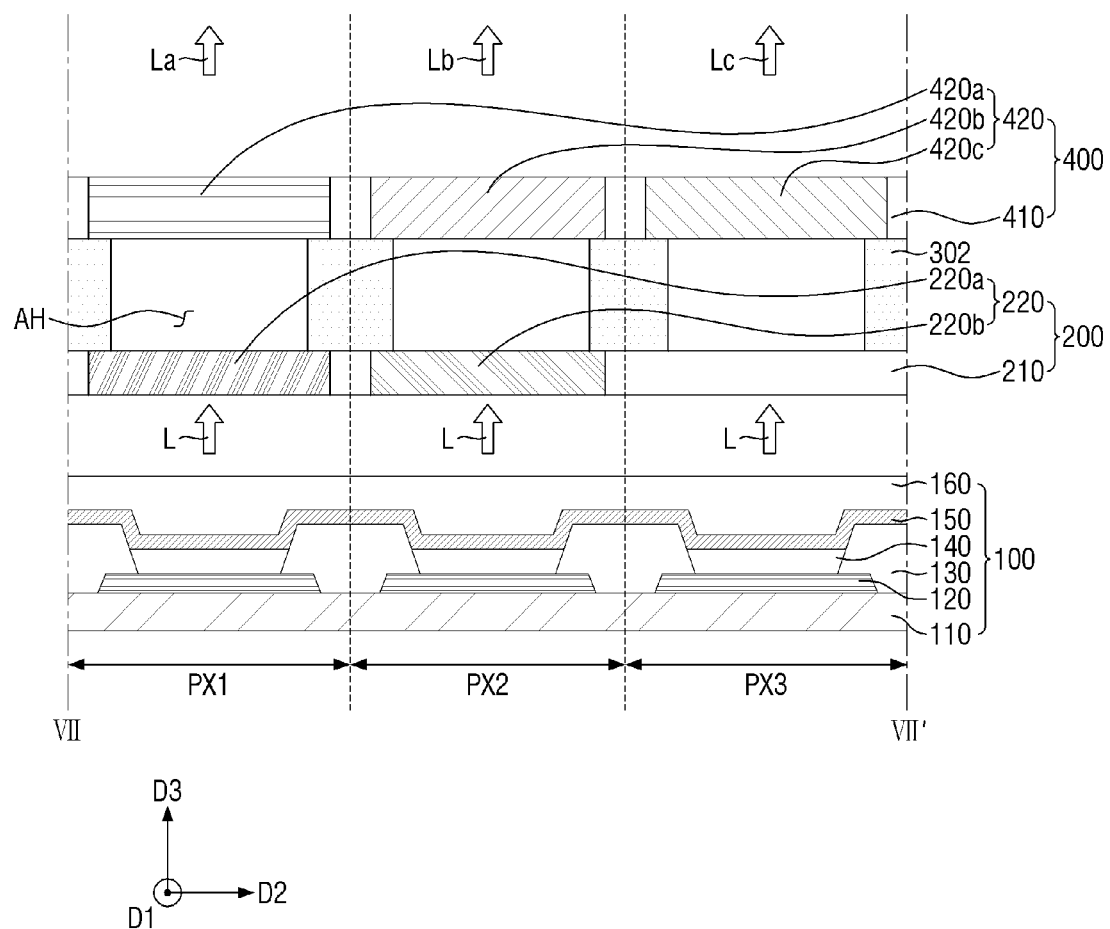
FIG. 7 is a cross-sectional view taken along line VII-VII' of the display device shown in FIG. 6.

FIG. 6 is an exploded, perspective view of a display device 30 according to another exemplary embodiment of the present disclosure. FIG. 7 is a cross-sectional view taken along line VII-VII' of the display device 30 shown in FIG. 6.

The display device 30 of FIGS. 6 and 7 is identical to the display device 20 described above with reference to FIGS. 4 and 5 except that air holes AH are defined also at locations corresponding to the third pixel PX3 and the third wavelength filter layer 420c. Hereinafter, the redundant description will be omitted, and description will be made focusing on the differences.

Referring to FIGS. 6 and 7, a plurality of air holes AH may be further defined at the locations of a transparent frame 302 corresponding to the third pixel PX3 and the third wavelength filter layer 420c in addition to the locations corresponding to the first pixel PX1 and the first wavelength filter layer 220a and the locations corresponding to the second pixel PX2 and the second wavelength filter layer 220b. Accordingly, the light provided from the third pixel PX3 may pass through an empty space of the air holes AH without passing through the transparent frame 302, and thus the display device 30 may further reduce the optical loss.

Although only the plurality of air holes AH is defined in the transparent frame 302 in the drawing, this is merely an example. A plurality of air holes AH may be defined at the locations of the transparent frame 300 of FIGS. 1 and 3 corresponding to the third pixel PX3 and the third wavelength filter layer 420c, where the plurality of air gaps AG is defined. That is, in some embodiments of the present disclosure, the transparent frame 302 may have the air gaps AG together with the air holes AH.

While the present disclosure has been particularly illustrated and described with reference to exemplary embodiments, it will be understood by those of ordinary skill in the art that various changes in form and detail may be made therein without departing from the spirit and scope of the present disclosure as defined by the following claims. The exemplary embodiments should be considered in a descriptive sense only and not for purposes of limitation.

What is claimed is:

1. A display device comprising:
 a display element;
 a wavelength conversion element disposed on the display element and comprising a plurality of first wavelength conversion layers and a plurality of second wavelength conversion layers arranged in a first predetermined pattern;
 a transparent frame disposed on the wavelength conversion element and having a plurality of air gaps defined on a surface facing the wavelength conversion element, wherein the air gaps are recessed in a thickness direction; and
 a color filter element disposed on the transparent frame and comprising a plurality of first wavelength filter layers, a plurality of second wavelength filter layers, and a plurality of third wavelength filter layers arranged in a second predetermined pattern,
 wherein the first and second wavelength filter layers are arranged to overlap the first and second wavelength conversion layers, respectively, and
 wherein the air gaps are arranged to overlap the first and second wavelength conversion layers.

2. The display device of claim 1, wherein the first and second wavelength conversion layers convert light provided from the display element into lights of first and second wavelength bands, respectively,
 wherein the first, second, and third wavelength filter layers transmit lights of first, second, and third wavelength bands, respectively, and
 wherein the first, second, and third wavelength bands are different from one another.

3. The display device of claim 2, wherein the display element emits lights including the first, second, and third wavelength bands.

4. The display device of claim 2, wherein the first, second, and third wavelength bands are red, green, and blue wavelength bands, respectively.

5. The display device of claim 4, wherein the display element emits white light.

6. The display device of claim 1, wherein a refractive index of the air gaps is lower than refractive indices of the first and second wavelength conversion layers.

7. The display device of claim 1, wherein the transparent frame comprises a polymer.

8. The display device of claim 1, wherein the wavelength conversion element comprises:
 a base substrate,
 wherein the plurality of first and second wavelength conversion layers are arranged in the base substrate in the first predetermined pattern.

9. The display device of claim 8, wherein a thickness of the wavelength conversion element is equal to or less than 2 μm.

10. The display device of claim 8, wherein none of the first and second wavelength conversion layers is disposed at regions in the base substrate that correspond to the third wavelength filter layers.

11. The display device of claim 1, wherein the wavelength conversion element and the transparent frame are in contact with each other at least partially.

12. The display device of claim 11, wherein the transparent frame and the color filter element are in contact with each other at least partially.

13. The display device of claim 1, wherein the first and second wavelength conversion layers comprise quantum dots.

14. A display device comprising:
 a display element having a plurality of pixels defined thereon;
 a color filter element disposed on the display element and comprising a plurality of first wavelength filter layers, a plurality of second wavelength filter layers, and a plurality of third wavelength filter layers, each of the first, second, and third wavelength filter layers being arranged with the respective pixels;
 a wavelength conversion element disposed between the display element and the color filter element and comprising a plurality of first wavelength conversion layers and a plurality of second wavelength conversion layers arranged to overlap the first and second wavelength filter layers, respectively; and
 a transparent frame disposed between the color filter element and the wavelength conversion element and having a plurality of air holes formed through the transparent frame, wherein the air holes are arranged at locations corresponding to the first and second wavelength conversion layers, respectively.

15. The display device of claim 14, wherein the plurality of air holes is formed through the transparent frame at regions corresponding to the third wavelength filter layers.

16. The display device of claim 14, wherein the first and second wavelength conversion layers convert white light provided from the display element into red and green light, respectively, and wherein the first, second, and third wavelength filter layers transmit red, green, and blue lights, respectively.

17. The display device of claim 14, wherein a thickness of each of the first and second wavelength conversion layers is equal to or less than 2 μm.

18. The display device of claim 14, wherein the wavelength conversion element and the transparent frame are in contact with each other at least partially.

19. The display device of claim 14, wherein the transparent frame and the color filter element are in contact with each other at least partially.

20. The display device of claim 14, wherein the first and second wavelength conversion layers comprise quantum dots.

* * * * *